United States Patent [19]
Nayebi et al.

[11] Patent Number: 5,784,122
[45] Date of Patent: Jul. 21, 1998

[54] CHROMA LOCK DETECTOR

[75] Inventors: Mehrdad Nayebi, Palo Alto; Duc Ngo, San Jose, both of Calif.

[73] Assignees: Sony Corporation, Tokyo, Japan; Sony Electronics, Inc., Park Ridge, N.J.

[21] Appl. No.: 585,442

[22] Filed: Jan. 11, 1996

Related U.S. Application Data

[60] Provisional application No. 60/004,404, Jun. 21, 1995.

[51] Int. Cl.[6] .............. H04N 5/08; H03L 7/06; H03L 7/00
[52] U.S. Cl. .......... 348/549; 348/505; 331/1 A; 331/17; 331/DIG. 2; 327/157
[58] Field of Search ................ 348/539, 537, 348/536, 505, 506, 508, 549; 331/1 A, 17, 25, DIG. 2, 74, 16; 327/39, 43, 2, 156, 157, 141; H04N 5/08

[56] References Cited

U.S. PATENT DOCUMENTS

| | | | |
|---|---|---|---|
| 4,175,267 | 11/1979 | Tachi | 358/4 |
| 4,318,119 | 3/1982 | Tatsuzawa | 358/8 |
| 4,410,861 | 10/1983 | Werner | 331/25 |
| 4,437,072 | 3/1984 | Asami | 331/1 A |
| 4,626,911 | 12/1986 | Sasaki et al. | 358/141 |
| 4,729,013 | 3/1988 | Tatami et al. | 358/19 |
| 4,780,769 | 10/1988 | Numakura et al. | 358/320 |
| 4,964,000 | 10/1990 | Kanota et al. | 360/77.14 |
| 5,126,690 | 6/1992 | Bui et al. | 331/1 A |
| 5,128,632 | 7/1992 | Erhart et al. | 331/1 A |
| 5,253,042 | 10/1993 | Yasuda | 358/19 |
| 5,530,383 | 6/1996 | May | 327/39 |

*Primary Examiner*—Michael H. Lee
*Attorney, Agent, or Firm*—Haverstock & Owens LLP

[57] ABSTRACT

A chroma lock detector circuit monitors charge pump control signals within a phase-lock loop to determine when two input signals to the phase-lock loop are locked together in phase and generates an output signal which is active when the two input signals are locked together in phase and inactive when the two input signals are not locked together in phase. The charge pump control signals are generated in response to a difference in phase between the two input signals and will become inactive once the two input signals are locked together in phase. When the charge pump control signals are inactive for a predetermined period of time, the output of the chroma lock detector circuit is activated and will remain active until the charge pump control signals are again active. A current source is enabled when either of the control signals are active. The current source builds up a first level of charge on a first capacitor during the burst period. A detecting circuit monitors the first level of charge to determine when it rises above a first threshold value. A second level of charge is built up on a second capacitor when the first level of charge is above the first threshold value. An output signal is activated when the second level of charge rises above a second threshold value and deactivated when the second level of charge falls below a third threshold level. When the output signal is active, the two input signals are locked together in phase.

13 Claims, 5 Drawing Sheets

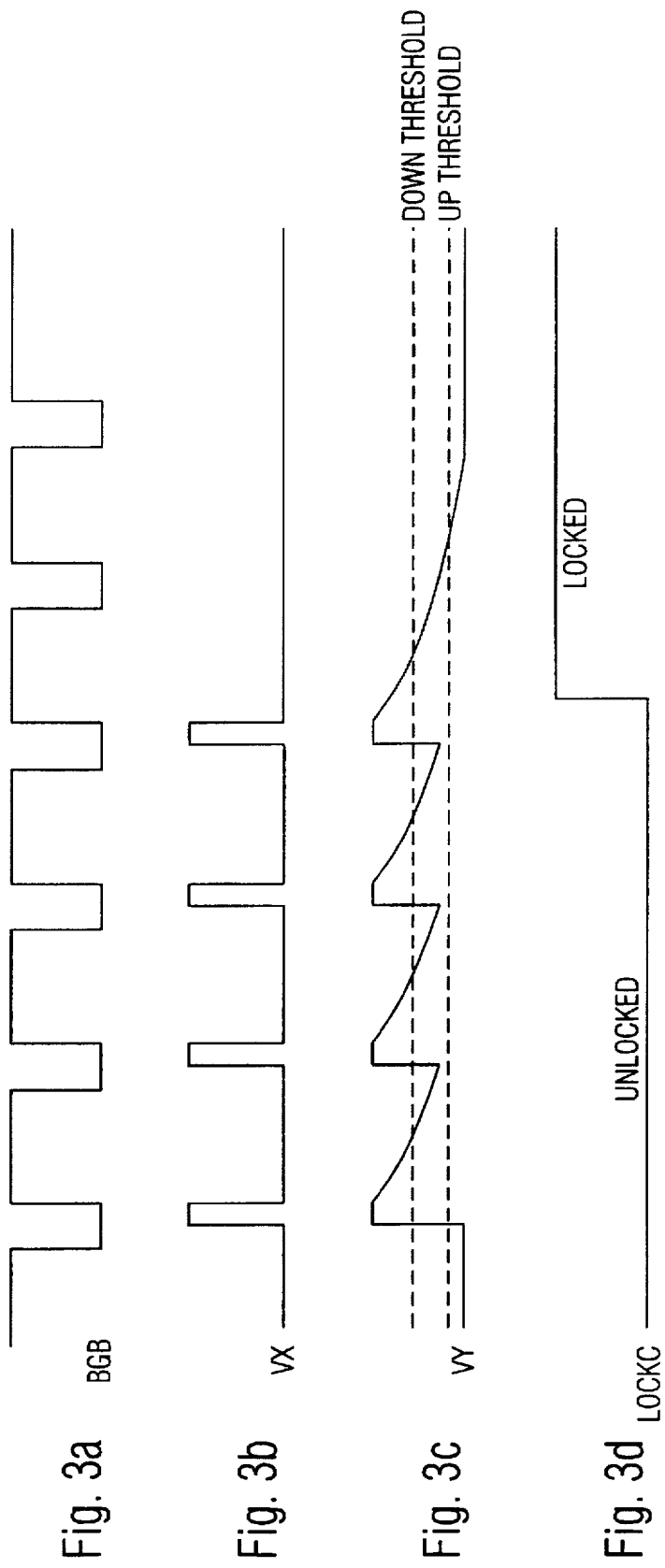

CHROMA LOCK DETECTOR

RELATED APPLICATIONS:

This application claims priority under 35 U.S.C. § 119(e) of the co-pending U.S. provisional application Ser. No. 60/000,404 filed on Jun. 21, 1995 and entitled "Chroma Lock Detector." The provisional application Ser. No. 60/000,404, filed on Jun. 21, 1995 and entitled "Chroma Lock Detector" is also hereby incorporated by reference.

FIELD OF THE INVENTION

The present invention relates to the field of locking the phase and frequency of two signals together. More particularly, the present invention relates to the field of detecting when two signals are locked together in phase and frequency.

BACKGROUND OF THE INVENTION

The technique of digitally encoding a video signal and particularly a composite video signal, is well known. Sampling pulses are generated in synchronism with a color video burst signal. The sampling pulses have a repetition rate that is a multiple of the burst signal frequency. Each sample of the color video signal is encoded, or digitized, such as by pulse code modulation (PCM). Digitally encoded video signals are used in time base error correction devices, noise suppression devices, the addition of various special video effects and the like. Digitally encoded video signals are particularly advantageous for recording and reproduction and also for special types of transmission.

In many video transmission systems, color or chrominance information is represented by a particular phase of the chrominance subcarrier signal that is amplitude modulated with color information. Since the phase of the color subcarrier signal is used to represent color information, it is important that, when digitally encoding the color video signal, the phase of the sampling pulses be accurately controlled. Undesired phase shifts, such as may be due to temperature drift, aging of the electrical components, and the like, may result in a phase error in the sampling pulse relative to the chrominance subcarrier signal which has the effect of distorting or interfering with the overall chrominance effect of the video picture which ultimately is reproduced from the digitally encoded video signal.

To identify the aforementioned phase shifts between the sampling pulses and the chrominance subcarrier signal, the instantaneous phase angle of the burst signal at the time of sampling is determined. If the phase angle of the burst signal differs from a desired phase angle, the phase of the sampling pulses may be adjusted accordingly. If the phase angle of the burst signal is different than an expected phase angle, the phase difference between the modulated chrominance information and the signal will also be in error, thereby causing distortion of the color within an output video signal.

A composite color video signal includes horizontal synchronizing signals, a burst signal superimposed onto the pedestal level at the back porch of the horizontal synchronizing signal and a video information signal. The video information signal comprises a chrominance subcarrier having different phases amplitude-modulated with chrominance information. The composite color video signal includes both luminance and chrominance information.

Separator circuits are utilized to separate the horizontal synchronizing signal and the burst signal from the incoming video signal. The burst signal has a burst signal frequency equal to 3.58 MHz, which is the frequency of the chrominance subcarrier $f_{SC}$.

A phase-lock loop is used to lock in phase and frequency two input composite video signals or the sampling pulses relative to an incoming burst signal. The actual phase of the sampling pulses relative to the phase of the chrominance subcarrier signal may drift from the phase-lock relationship. This drift may be due to temperature changes in temperature-sensitive circuit components, changes in the operation of such components due to age, and the like. As a result of this phase shift in the sampling pulses, errors, such as phase errors, may be introduced into the sampled video signal. If left uncorrected, the color of the video picture reproduced from the sampled video signal, having the phase errors, may be erroneous.

In order to correct the above-mentioned phase errors, a phase-lock loop is used to detect errors in phase and adjust the phase of a signal accordingly. A charge pump circuit is generally included within a phase-lock loop. The charge pump circuit is provided with one or more control input signals. A level of charge is built up on a circuit storage element, typically a capacitor, in response to the control signals. The control input signals are typically provided from a phase detector circuit which generates one or more control signals representative of the difference in the phase of the two signals which are to be locked in phase together. The charge built up on the circuit storage element then corresponds to the level of the control signal generated by the phase detector circuit. Within phase-lock loops the charge which is built up on the circuit storage element is used to control the frequency of an output signal generated by a voltage controlled oscillator. By varying the charge stored on the circuit storage element using the charge pump circuit, the frequency and phase of the signal generated by the voltage controlled oscillator is controlled and locked to the phase and frequency of a reference signal.

A basic architecture of a conventional charge pump circuit of the prior art is illustrated in FIG. 1. The charge pump circuit includes two current sources IUp and IDown, two switches S1 and S2 and the charge pump capacitor CH. A first terminal of the current source IUp is coupled to a voltage source VCC. A second terminal of the current source IUp is coupled to a first terminal of the switch S1. A second terminal of the switch S1 is coupled to a first terminal of the switch S2 and a first terminal of the capacitor CH. A second terminal of the capacitor CH is coupled to ground. A second terminal of the switch S2 is coupled to a first terminal of a current source IDown. A second terminal of the current source IDown is coupled to ground. A control signal UP is coupled to control the operation of the switch S1. A control signal DOWN is coupled to control the operation of the switch S2.

The control signals UP and DOWN are provided from a phase detector circuit within a phase-lock loop in response to a difference in phase between a signal and reference signal. Accordingly, if there is a positive phase difference between the signal and the reference signal, the control signal DOWN will be activated in order to correct the phase difference by discharging the capacitor CH through the current source IDown. If there is a negative phase difference between the signal and the reference signal, the control signal UP will be activated in order to correct the phase difference by charging the capacitor CH from the current source IUp. The voltage stored across the capacitor CH is then used by an oscillating circuit to modify the phase and frequency of the signal until it is locked in phase with the reference signal. When the signals are locked in phase, the control signals UP and DOWN both remain inactive, at a logical low voltage level or both.

SUMMARY OF THE INVENTION

A chroma lock detector circuit monitors charge pump control signals within a phase-lock loop to determine when two input signals to the phase-lock loop are locked together in phase. An output signal is generated by the chroma lock detector circuit which is active when the two input signals are locked together in phase and inactive when the two input signals are not locked together in phase. The charge pump control signals are generated by a phase detector circuit within the phase-lock loop in response to a difference in phase between the two input signals. Once the two input signals are locked together in phase, the charge pump control signals will become inactive. When the charge pump control signals are inactive for a predetermined period of time, signalling that the two input signals are locked together in phase, the output of the chroma lock detector circuit is activated and will remain active until the charge pump control signals are again active.

A current source is enabled when either of the control signals are active. The current source builds up a first level of charge on a first capacitor during the burst period. A detecting circuit monitors the first level of charge to determine when it rises above a first threshold value. A second level of charge is built up on a second capacitor when the first level of charge is above the first threshold value. An output circuit is coupled to the second capacitor for generating an output signal which is activated when the second level of charge rises above a second threshold value and deactivated when the second level of charge falls below a third threshold level. When the output signal is active the two input signals are locked together in phase.

DETAILED DESCRIPTION OF THE PREFERRED EMBODIMENT

Figure 1:
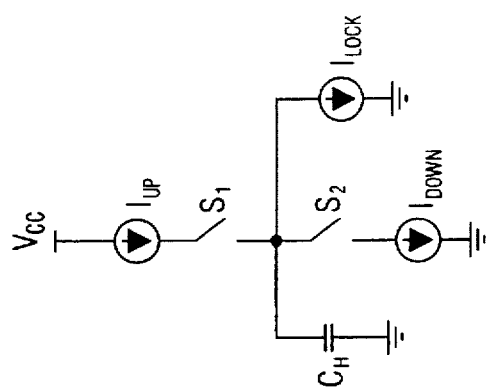
FIG. 1 illustrates a schematic diagram of a charge pump circuit.

A chroma lock detector circuit monitors the charge pump control signals within a phase-lock loop in order to determine when two input signals to the phase-lock loop are locked together in phase. An output signal is generated by the chroma lock detector circuit which is active when the two signals are locked together in phase and inactive when the two input signals are not locked together in phase. The charge pump control signals UP and DOWN are generated by a phase detector circuit within the phase-lock loop in response to a difference in phase between the two input signals. In response to the charge pump control signals, a charge pump circuit generates an output which is used to either increase or decrease the frequency of one of the two input signals in order to lock it in phase with the other signal. Once the two input signals are locked together in phase, the charge pump control signals become inactive.

The chroma lock detector circuit also receives the charge pump control signals as inputs for determining when the charge pump control signals both become inactive. As long as the charge pump control signals UP and DOWN are active, a difference in phase exists between the two signals and the output signal of the chroma lock detector circuit remains inactive. When the charge pump control signals are inactive for a predetermined period of time, signalling that the two signals are locked together in phase, the output of the chroma lock detector circuit is activated and will remain at a logical high voltage level until the charge pump control signals become active again.

If the charge pump control signals are active during the period when the burst signal is present within the input composite video signal, then a charge is built up across a first storage element, raising a voltage level across the first storage element. The voltage level across the first storage element is only charged up during a burst period, when an inverse burst gate signal BGB is inactive. The first storage element is discharged when the inverse burst gate signal BGB is active. A burst gate signal BG is generated by a burst gate pulse generator and is active during a burst period, when the burst signal is present within the input composite video signal. The inverse burst gate signal BGB is therefore inactive when the burst signal is present within the input composite video signal.

During the burst period, the voltage level across the first storage element is increased, when the charge pump control signals are active, until it reaches a first threshold level. When the voltage level across the first storage element reaches the first threshold level, an output of a flip-flop is set to a logical high voltage level. The output of the flip-flop is reset at the end of the burst period when the inverse burst gate signal BGB rises to a logical high voltage level. While the output of the flip-flop is at a logical high voltage level it is used to build up a charge and raise a voltage level across a second storage element. When the voltage level across the second storage element reaches a second threshold level, an output signal is pulled to a logical low voltage level, signalling that the two input signals to the phase lock loop are not locked together in phase. The output signal is maintained at the logical low voltage level as long as the charge pump control signals are active.

When the charge pump control signals UP and DOWN are both inactive, the voltage level across the first storage element is not increased and will therefore never reach the first threshold level to set the output of the flip-flop. Because the output of the flip-flop is not set, the second storage element will get discharged through a resistor causing the voltage level across the second storage element to drop. When the voltage level across the second storage element decreases past a third threshold level, the output signal is raised to a logical high voltage level, signalling that the two input signals to the phase-lock loop are locked together in phase. The output signal is maintained at the logical high voltage level until the charge pump control signals are again active.

Figure 2:
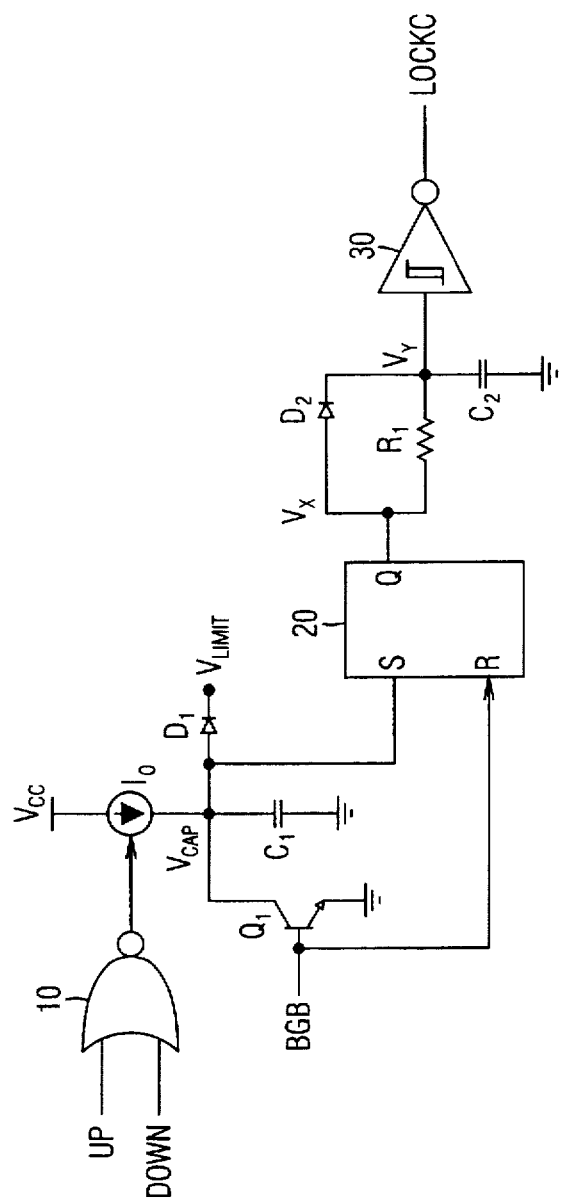
FIG. 2 illustrates a schematic diagram of a chroma lock detector circuit of the present invention.
Figure 4A:
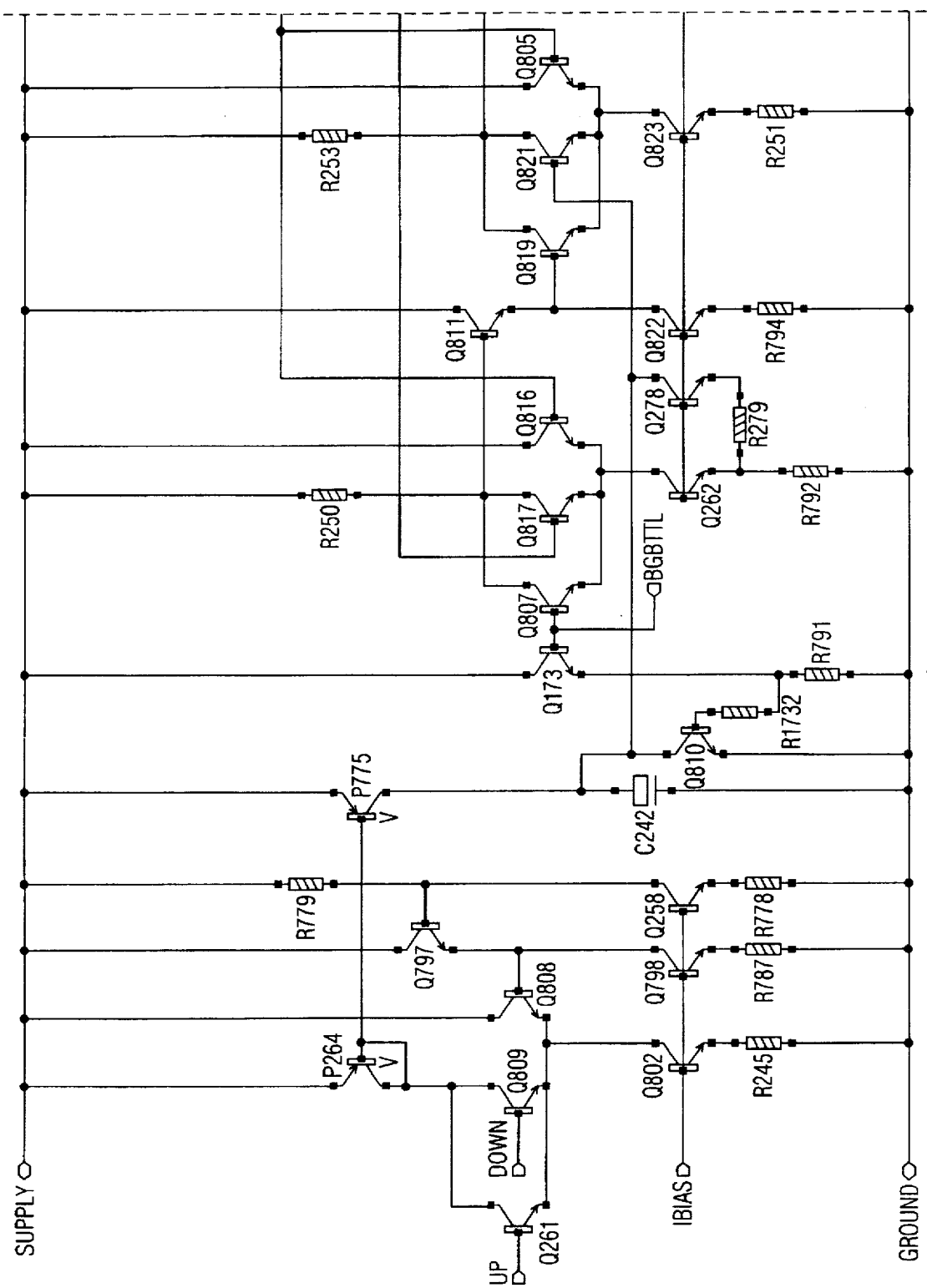
FIG. 4 illustrates a detailed schematic diagram of a preferred embodiment of the chroma lock detector circuit of the present invention.
Figure 4B:
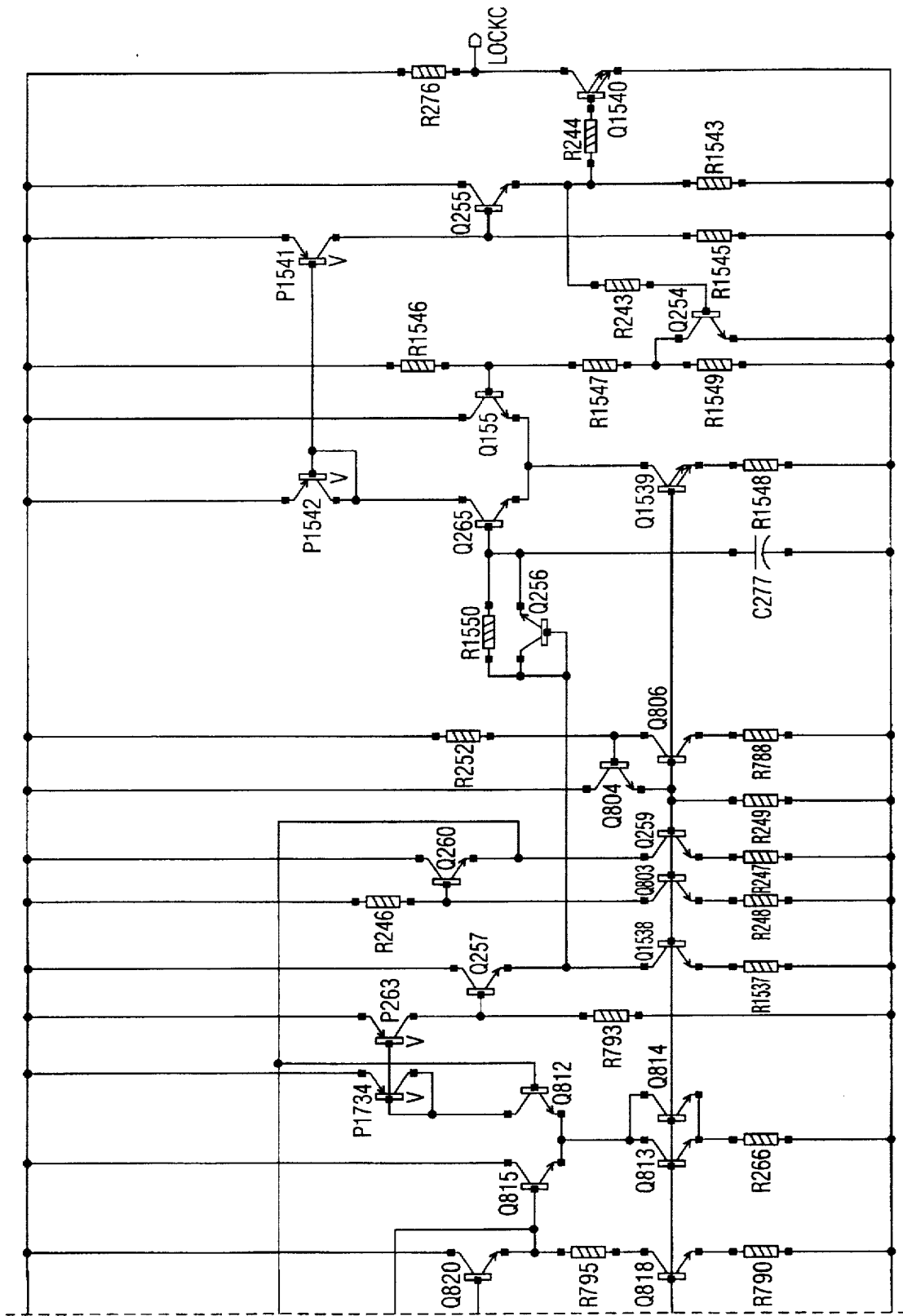
Figure 1:
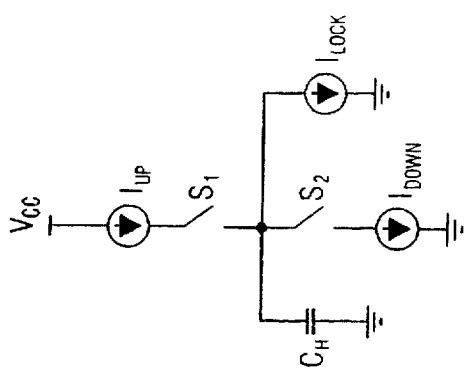
Figure 2:
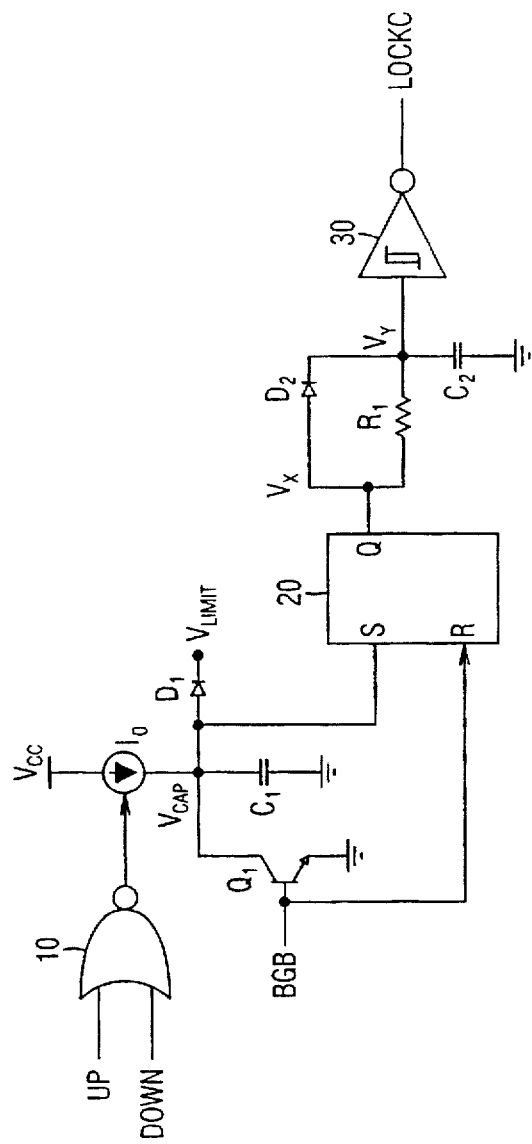

A schematic block diagram of a chroma lock detector circuit of the present invention is illustrated in FIG. 2. A burst gate signal is generated by the video system when the burst signal is present within the input composite video signal. An inverse burst gate signal BGB is an inverse of the burst gate signal and is therefore active when the burst signal is not present within the input composite video signal. The inverse burst gate signal BGB is coupled to a base of an npn transistor Q1 and to a reset input of an RS flip-flop 20. Control signals UP and DOWN which are generated within a phase-lock loop in order to control a charge pump circuit are coupled as inputs to a logical NOR gate 10. An output of the logical NOR gate 10 is coupled to control a current source 10. A first terminal of the current source 10 is coupled to a supply voltage VCC. A collector of the transistor Q1 is coupled to a second terminal of the current source IO, to a first terminal of a capacitor C1, to an anode of a diode D1 and to a set input of the RS flip-flop 20, thereby forming a voltage node VCAP representative of the voltage level across the capacitor C1. An emitter of the transistor Q1 is coupled to ground. A second terminal of the capacitor C1 is coupled to ground. A cathode of the diode D1 is coupled to a constant biasing voltage VLimit. The diode D1 and the constant biasing voltage VLimit keep the voltage level at the voltage node VCAP from falling below a known value equal to a diode drop plus the value of the constant biasing voltage VLimit. This prevents the current source IO from saturating.

An output Q of the RS flip-flop 20 is coupled to an anode of a diode D2 and to a first terminal of a resistor R1, thereby forming a voltage node VX representative of the voltage level of the output of the RS flip-flop 20. A cathode of the diode D2 is coupled to a second terminal of the resistor R1, to a first terminal of a capacitor C2 and to an input of an inverting schmitt trigger circuit 30, thereby forming a voltage node VY representative of the voltage level across the capacitor C2. A second terminal of the capacitor C2 is coupled to ground. An output of the inverting schmitt trigger circuit 30 provides an active high output LockC of the chroma lock detector circuit of the present invention.

Figure 3:
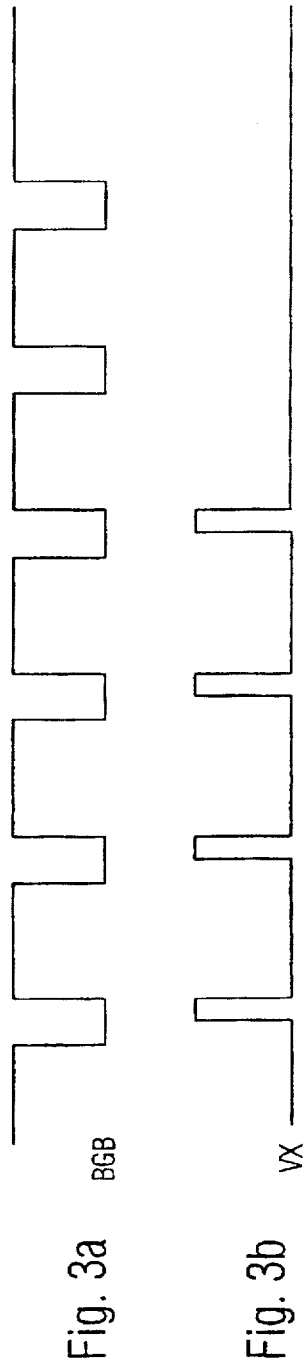
FIG. 3a illustrates a timing diagram of an inverse burst gate signal BGB supplied to the chroma lock detector circuit of FIG. 2.
FIG. 3b illustrates a timing diagram of a signal at a voltage node VX within the chroma lock detector circuit of FIG. 2.
FIG. 3c illustrates a timing diagram of a signal at a voltage node VY within the chroma lock detector circuit of FIG. 2.
FIG. 3d illustrates a timing diagram of an output signal LockC with the chroma lock detector circuit of FIG. 2.
Figure 3:
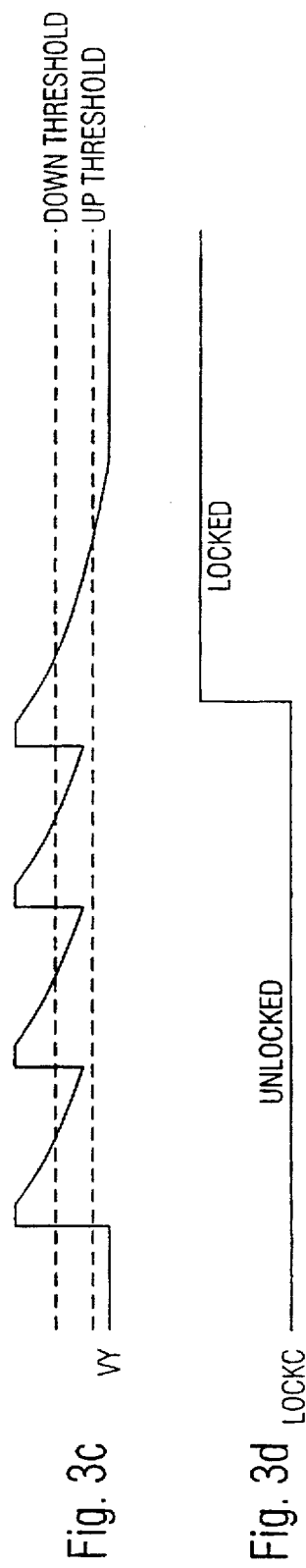
Figure 4A:
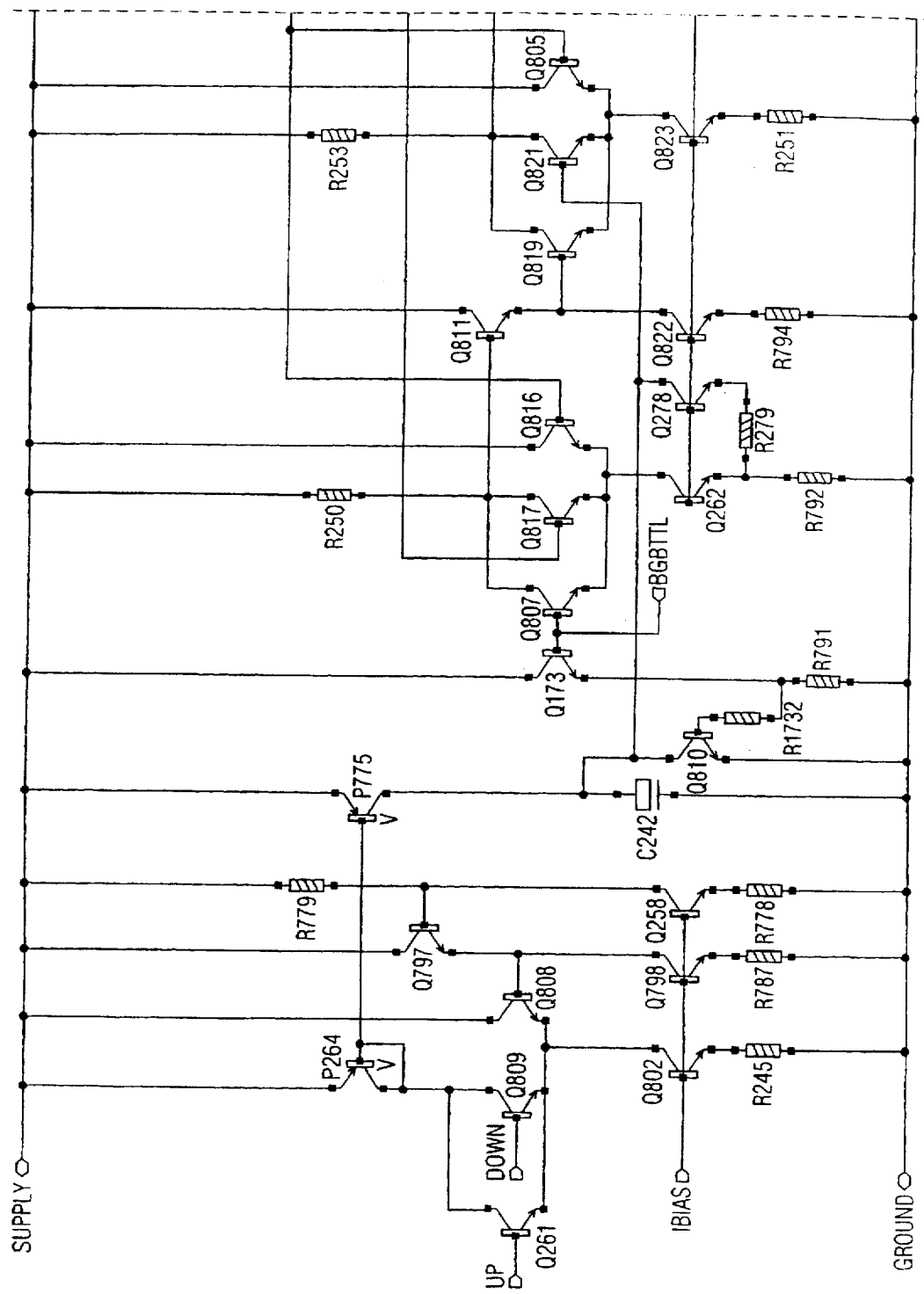
Figure 4B:
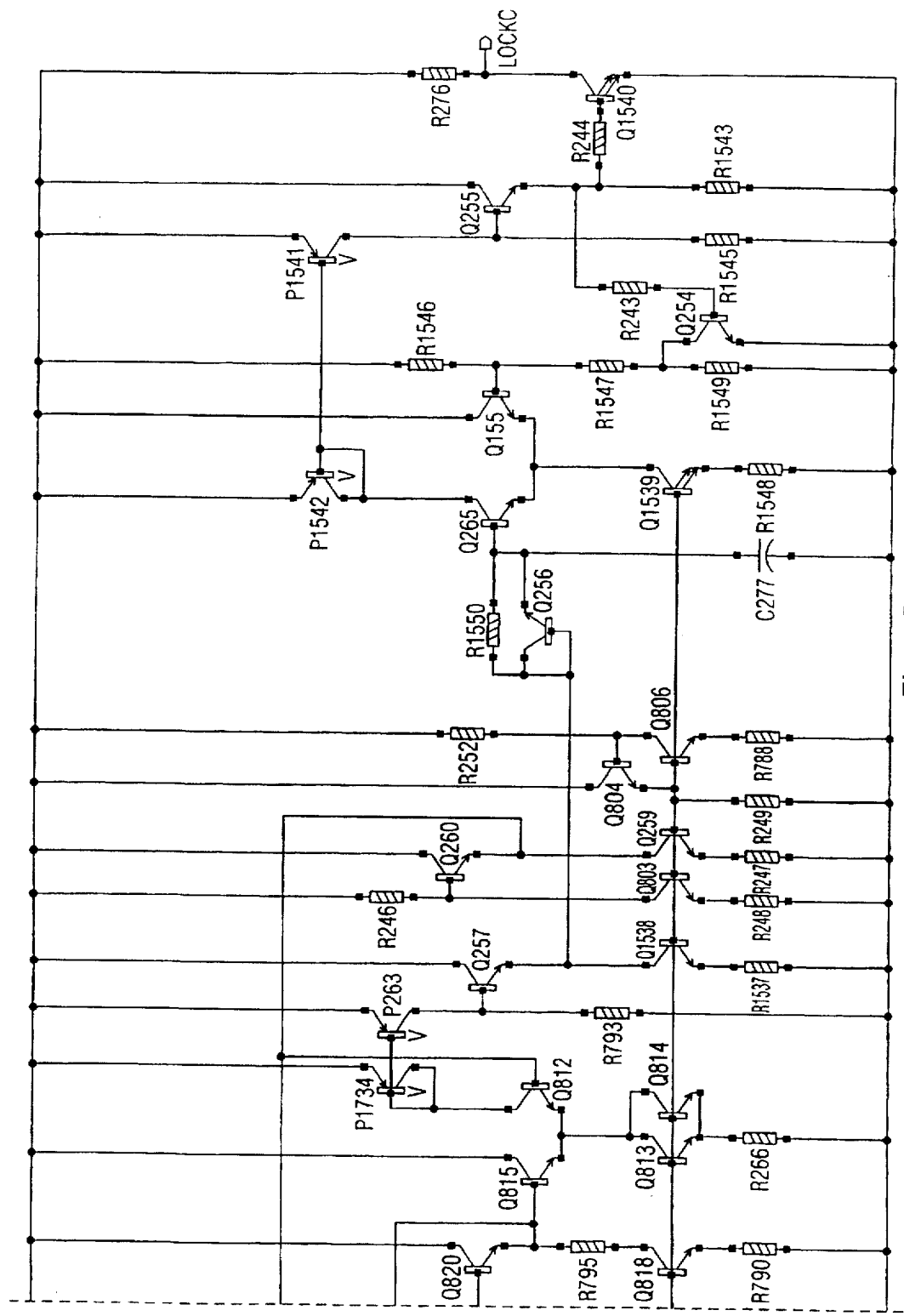

Timing diagrams of selected signals within the chroma lock detector circuit of the present invention are illustrated in FIG. 3. The timing diagrams illustrated in FIG. 3 are shown to correspond to each other in time. The inverse burst gate signal BGB is illustrated in FIG. 3a. A signal at the voltage node VX is illustrated in FIG. 3b. A signal at the voltage node VY is illustrated in FIG. 3c. The output signal LockC is illustrated in FIG. 3d.

When either one of the charge pump control signals UP or DOWN are active, the output of the logical NOR gate 10 is at a logical low voltage level. The current source IO is enabled and will supply current to the capacitor C1 when the output of the logical NOR gate 10 is at a logical low voltage level. During a non-burst period, when the inverse burst gate signal BGB is at a logical high voltage level, the transistor Q1 is on and the capacitor C1 is discharged through the transistor Q1. During a burst period, when the inverse burst gate signal BGB is at a logical low voltage level, the transistor Q1 is off and the discharge path for the capacitor C1 is disabled. During this time, if either of the control signals UP and DOWN are active, the current source 10 will supply current to the capacitor C1 and charge up the voltage level across the capacitor C1 and at the voltage node VCAP. When the voltage level at the voltage node VCAP reaches a logical high voltage level threshold, the output of the flip-flop 20 and the voltage level at the voltage node VX will be set to a logical high voltage level. As illustrated in FIGS. 3a and 3b, there is a delay from the beginning of the burst period until the voltage level at the node VX is raised to a logical high voltage level because of the time necessary to charge the capacitor C1 and raise the voltage level at the voltage node VCAP to a logical high voltage level.

When the voltage level at the node VX is at a logical high voltage level, the capacitor C2 is charged, which raises the voltage level at the voltage node VY. The diode D2 provides a low impedance path through which the capacitor C2 is charged. When the voltage level at the voltage node VY rises above a first threshold level of the schmitt trigger circuit 30, the output LockC of the schmitt trigger circuit 30 and of the chroma lock detector is pulled to a logical low voltage level, signalling that the two input signals to the phase-lock loop are not locked together in phase. The schmitt trigger circuit 30 includes the first threshold level and a second threshold level. Because the schmitt trigger circuit 30 includes an inverter circuit, the first threshold level is above the second threshold level. When the voltage level at the voltage node VY rises above the first threshold level, the output of the schmitt trigger circuit 30 is pulled to a logical low voltage level. When the voltage level at the node VY falls below the second threshold level, the output of the schmitt trigger circuit 30 is raised to a logical high voltage level.

At the end of the burst period, when the inverse burst gate signal BGB rises to a logical high voltage level, the output of the flip-flop 20 and the voltage level at the voltage node VX are reset and pulled to a logical low voltage level. Because the inverse burst gate signal BGB is at a logical high voltage level, the transistor Q1 is on and any charge stored across the capacitor C1 is discharged through the transistor Q1. The voltage level across the capacitor C2 and at the voltage node VY will therefore begin to discharge through the resistor R1. If the control signals UP and DOWN are active during the next burst period, the voltage level across the capacitor C2 and at the voltage node VY will be charged up again. The values of the capacitor C2 and the resistor R1 have been chosen so that the voltage level across the capacitor C2 and at the voltage node VY will not be pulled below the up threshold level of the schmitt trigger 30 during the non-burst period. Therefore, as long as the control signals UP and DOWN are active, the output LockC of the schmitt trigger circuit 30 will remain at a logical low voltage level.

Once the charge pump control signals UP and DOWN are both inactive, the current source IO is disabled and the capacitor C1 is not charged up during the burst period. The voltage level at the voltage node VCAP will therefore not rise above a logical high voltage level threshold and will not set the flip-flop 20. Accordingly, the output of the flip-flop 20 and the voltage level at the voltage node VX is not set or raised to a logical high voltage level when the control signals UP and DOWN are both inactive. The voltage level across the capacitor C2 and at the voltage node VY will therefore discharge below the up threshold level of the schmitt trigger circuit 30. The output LockC of the schmitt trigger circuit 30 and of the chroma lock detector circuit of the present invention will correspondingly rise to a logical high voltage level, signalling that the two input signals to the phase-lock loop are locked together in phase. The output LockC will remain at a logical high voltage level until the charge pump control signals UP and DOWN are again active, signalling that the two input signals to the phase-lock loop are out of phase.

A detailed circuit schematic of the preferred embodiment of the chroma lock detector circuit is illustrated in FIG. 4. The preferred embodiment of the present invention is implemented within a video/graphics overlay integrated circuit, Part No. CXA2015Q, which will be available from Sony Corporation of America, 3300 Zanker Road, San Jose, Calif. 95134. A phase-lock loop within this video/graphics overlay integrated circuit receives an analog input composite video signal and a digital input composite video signal. The phase and frequency of the digital input composite video signal is adjusted by the phase-lock loop until it is locked in phase with the analog input composite video signal. A phase detector circuit within the phase-lock loop monitors the difference in phase between the digital input composite video signal and the analog input composite video signal. The phase detector circuit generates the charge pump control signals UP and DOWN which are used to control a charge pump circuit. This phase-lock loop circuit is described in co-pending U.S. patent application Ser. No. 08/585/398 filed on the same date as the present application and entitled "Automatic Phase Control Apparatus For Phase Locking The Chroma Burst Of Analog And Digital Video Data Using A Numerically Controlled Oscillator," which is hereby incorporated by reference. The chroma lock detector circuit of the present invention monitors the charge pump control signals generated by the phase detector circuit, as described above, in order to determine when the digital input composite video signal is locked in phase with the analog input composite video signal.

Figure 5:
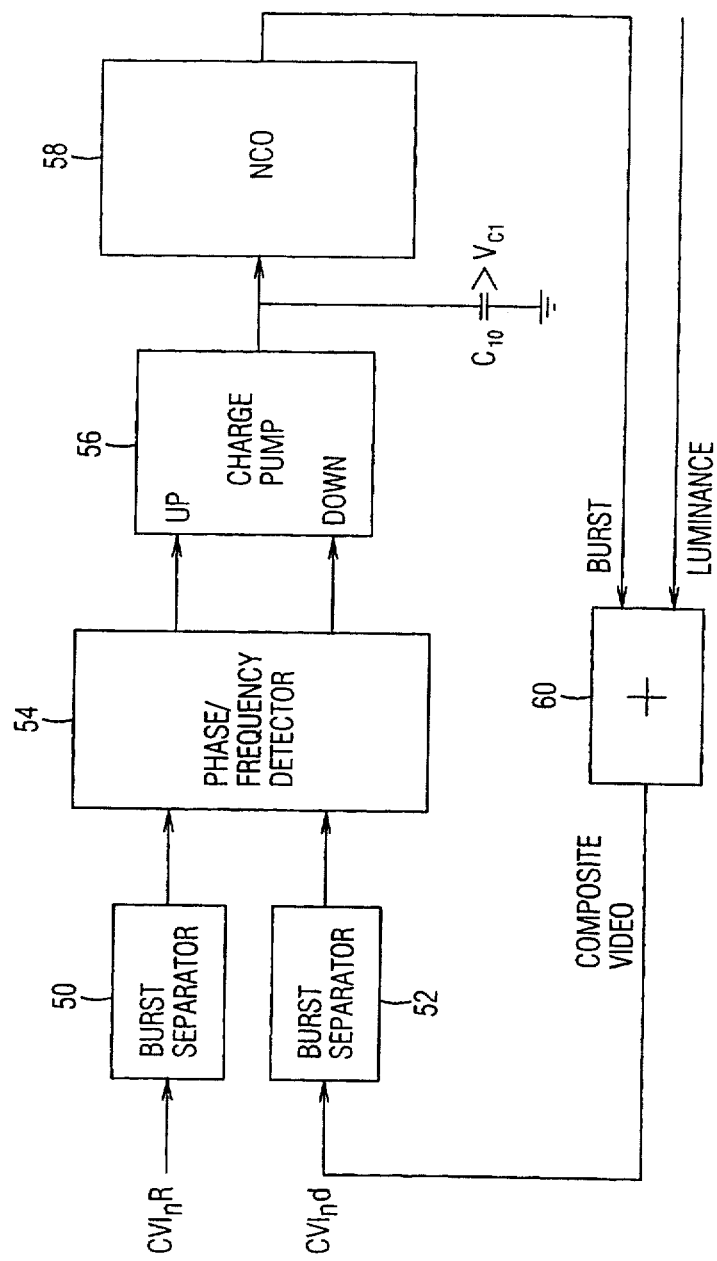
FIG. 5 illustrates a block diagram schematic of an automatic phase correction circuit.

A block diagram schematic of an automatic phase correction circuit is illustrated in FIG. 5. In the automatic phase correction circuit illustrated in FIG. 5, the analog input composite video reference signal CVInR is coupled as an input to a burst separator circuit 50 for separating the analog burst signal from the analog input composite video signal CVInR. The digital composite video signal CVInd is coupled as an input to a burst separator circuit 52 for separating the digital burst signal from the digital composite video signal CVInd. The outputs of both of the burst separators 50 and 52 are coupled as inputs to the phase/frequency detector circuit 54. The phase/frequency detector circuit 54 compares the two inputs and detects any difference in phase or frequency between the burst signals of the analog input composite video signal CVINR and the digital input composite video signal CVInd. If the phase/frequency detector circuit 54 detects any difference in phase or frequency between the two inputs then a correction signal is output from the phase/frequency detector circuit 54. The phase/frequency detector circuit 54 is coupled to a charge pump 56 to provide an up correction signal input and a down correction signal input which correspond to the detected difference between the phase and frequency of the two inputs. An output of the charge pump 56 is coupled to a first terminal of a capacitor C10 and as an input to a numerically controlled oscillator 58. A second terminal of the capacitor C10 is coupled to ground. The output from the charge pump 56 is used to build a charge up on the capacitor C10 which controls the operation of the numerically controlled oscillator (NCO) 58. The output oscillation signal from the NCO 58 is input to an adder 60 which combines the burst oscillation signal output from the NCO 58 with a luminance information signal into the digital composite video signal CVInd. In this manner the automatic phase correction circuit adjusts the phase of the digital composite video signal CVInd to lock it to the phase of the analog input composite video signal CVInR. The signals Up and Down from the phase/frequency detector circuit 54 are coupled to the logical NOR gate 10 of FIG. 2.

While the preferred embodiment of the present invention has been illustrated and described as an integrated circuit using bipolar transistors, it will be apparent to a person of ordinary skill in the art that the circuit of the present invention may be implemented using another device technology, including but not limited to CMOS, MOS, discrete components and ECL. It will also be apparent to those skilled in the art that different logic circuit configurations could be substituted for the logic circuit described above to perform the functions of the preferred embodiment.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

We claim:

1. A phase lock detector for detecting when two input signals are locked together in phase comprising:
   a. a monitoring circuit for monitoring one or more control signals used to control a phase of one of the two input signals, wherein the one or more control signals are inactive when the two input signals are locked together in phase;
   b. a first storage element for strong a first level of charge;
   c. a charge delivery device coupled to the monitoring circuit and to the first storage element for increasing the first level of charge when the one or more control signals are active;
   d. a detecting circuit for detecting when the first level of charge increases past a first threshold value,
   e. a second storage element coupled to the detecting circuit for strong a second level of charge wherein the second level of charge is increased when the first level of charge is above the first threshold value; and
   f. an output circuit coupled to the second storage element for generating an output signal in response to the second level of charge, representative of whether the two input signals are locked together in phase.

2. The phase lock detector as claimed in claim 1 wherein the first storage element is a capacitor.

3. The phase lock detector as claimed in claim 1 wherein the second storage element is a capacitor.

4. The phase lock detector as claimed in claim 1 wherein the output signal is activated when the second level of charge rises above a second threshold value and deactivated when the second level of charge falls below a third threshold value.

5. A method of detecting when two input signals are locked together in phase comprising the steps of:
   a. monitoring one or more control signals from a phase-lock loop, used to control a phase of one of the two input signals, wherein the one or more control signals are inactive when the two input signals are locked together in phase; and
   b. increasing a first level of charge across a first storage element when the one or more control signals are active;
   c. detecting when the first level of charge increases past a first threshold value;
   d. increasing a second level of charge across a second storage element when the first level of charge is above the first threshold value; and
   e. generating an output signal in response to the second level of charge which is active when the one or more control signals are inactive for a predetermined period of time, representing that the two input signals are locked together in phase.

6. The method as claimed in claim 5 wherein the output signal is activated when the second level of charge rises above a second threshold value and deactivated when the second level of charge falls below a third threshold value.

7. A phase-lock loop circuit for locking two input signals together in phase comprising:
   a. a receiving circuit configured for receiving two input signals;
   b. a phase detector circuit coupled to the receiving circuit for detecting a phase difference between the two input signals and generating one or more control signals for adjusting a phase of one of the two input signals, wherein the one or more control signals are inactive when the two input signals are locked together in phase;
   c. a first storage element coupled to the phase detector circuit for building up a first level of charge across the first storage element in response to the one or more control signals;
   d. a monitoring circuit coupled to the phase detector circuit for monitoring the one or more control signals;
   e. a second storage element for storing a second level of charge;
   f. a charge delivery device coupled to the monitoring circuit and to the second storage element for increasing the second level of charge when the one or more control signals are active;
   g. a detecting circuit for detecting when the second level of charge increases past a first threshold value;
   h. a third storage element coupled to the detecting circuit for storing a third level of charge wherein the third level of charge is increased when the second level of charge is above the first threshold value; and
   i. an output circuit coupled to the third storage element for generating an output signal, in response to the third level of charge, representative of whether the two input signals are locked together in phase.

8. The phase-lock loop circuit as claimed in claim 7 wherein the output signal is activated when the third level of charge rises above a second threshold value and deactivated when the third level of charge falls below a third threshold value.

9. The phase lock detector as claimed in claim 4 wherein the output circuit is a schmitt trigger circuit.

10. The phase lock detector as claimed in claim 9 wherein the two input signals are composite video signals.

11. The phase lock detector as claimed in claim 10 wherein the detecting circuit is a flip-flop which is reset after a burst period.

12. The phase lock loop circuit as claimed in claim 8 wherein the two input signals are composite video signals.

13. The phase lock loop circuit as claimed in claim 12 wherein the detecting circuit is a flip-flop which is reset after a burst period.

* * * * *

UNITED STATES PATENT AND TRADEMARK OFFICE
CERTIFICATE OF CORRECTION

PATENT NO. : 5,784,122  
DATED : July 21, 1998  
INVENTOR(S) : Nayebi et al.

Page 1 of 9

It is certified that error appears in the above-identified patent and that said Letters Patent is hereby corrected as shown below:

The title page should be deleted to appear as per attached title page.

Please delete drawing sheets 1-5 and substitute drawing sheets 1-6 as per attached ( to insert Fig. 5).

Signed and Sealed this

Sixth Day of July, 1999

*Attest:*

Q. TODD DICKINSON

*Attesting Officer*     *Acting Commissioner of Patents and Trademarks*

United States Patent [19]

Nayebi et al.

[11] Patent Number: 5,784,122
[45] Date of Patent: Jul. 21, 1998

[54] CHROMA LOCK DETECTOR

[75] Inventors: Mehrdad Nayebi, Palo Alto; Duc Ngo, San Jose, both of Calif.

[73] Assignees: Sony Corporation, Tokyo, Japan; Sony Electronics, Inc., Park Ridge, N.J.

[21] Appl. No.: 585,442

[22] Filed: Jan. 11, 1996

Related U.S. Application Data

[60] Provisional application No. 60/000,404 Jun. 21, 1995.
[51] Int. Cl.$^6$ .............................. H04N 5/08; H03L 7/06; H03L 7/00
[52] U.S. Cl. .................... 348/549; 348/505; 331/1 A; 331/17; 331/DIG. 2; 327/157
[58] Field of Search ........................... 348/539, 537, 348/536, 505, 506, 508, 549; 331/1 A, 17, 25, DIG. 2, 74, 16; 327/39, 43, 2, 156, 157, 141; H04N 5/08

[56] References Cited

U.S. PATENT DOCUMENTS

| | | | |
|---|---|---|---|
| 4,175,267 | 11/1979 | Tachi | 358/4 |
| 4,318,119 | 3/1982 | Tatsuzawa | 358/8 |
| 4,410,861 | 10/1983 | Werner | 331/25 |
| 4,437,072 | 3/1984 | Asami | 331/1 A |
| 4,626,911 | 12/1986 | Sasaki et al. | 358/141 |
| 4,729,013 | 3/1988 | Tatami et al. | 358/19 |
| 4,780,769 | 10/1988 | Numakura et al. | 358/320 |
| 4,964,000 | 10/1990 | Kanota et al. | 360/77.14 |
| 5,126,690 | 6/1992 | Bui et al. | 331/1 A |
| 5,128,632 | 7/1992 | Erhart et al. | 331/1 A |
| 5,253,042 | 10/1993 | Yasuda | 358/19 |
| 5,530,383 | 6/1996 | May | 327/39 |

*Primary Examiner*—Michael H. Lee
*Attorney, Agent, or Firm*—Haverstock & Owens LLP

[57] ABSTRACT

A chroma lock detector circuit monitors charge pump control signals within a phase-lock loop to determine when two input signals to the phase-lock loop are locked together in phase and generates an output signal which is active when the two input signals are locked together in phase and inactive when the two input signals are not locked together in phase. The charge pump control signals are generated in response to a difference in phase between the two input signals and will become inactive once the two input signals are locked together in phase. When the charge pump control signals are inactive for a predetermined period of time, the output of the chroma lock detector circuit is activated and will remain active until the charge pump control signals are again active. A current source is enabled when either of the control signals are active. The current source builds up a first level of charge on a first capacitor during the burst period. A detecting circuit monitors the first level of charge to determine when it rises above a first threshold value. A second level of charge is built up on a second capacitor when the first level of charge is above the first threshold value. An output signal is activated when the second level of charge rises above a second threshold value and deactivated when the second level of charge falls below a third threshold level. When the output signal is active, the two input signals are locked together in phase.

13 Claims, 6 Drawing Sheets

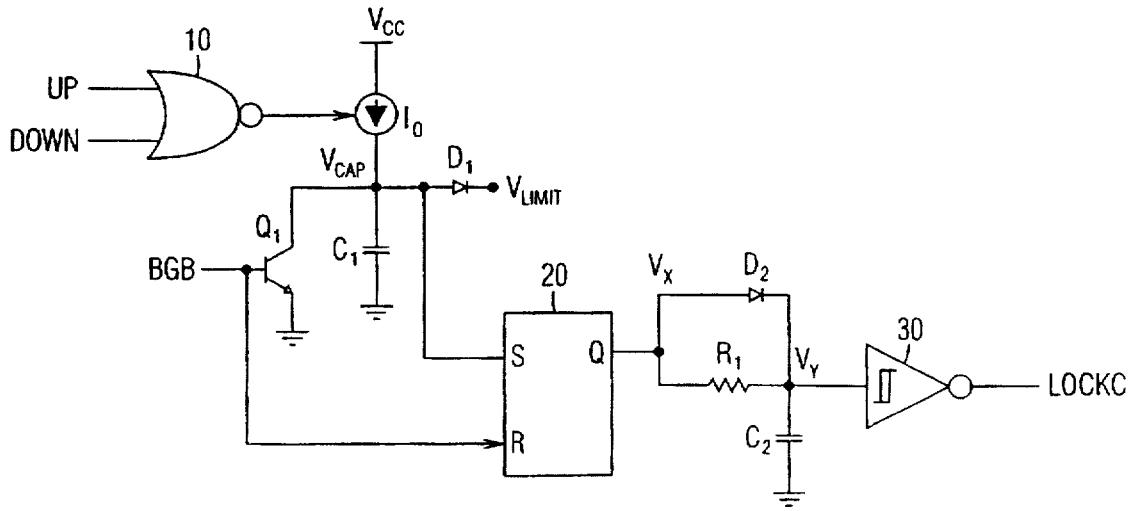

UNITED STATES PATENT AND TRADEMARK OFFICE
CERTIFICATE OF CORRECTION

PATENT NO. : 5,784,122

DATED : July 21, 1998

INVENTOR(S) : Nayebi et al.

It is certified that error appears in the above-identified patent and that said Letters Patent is hereby correct as shown below:

IN THE RELATED U.S. APPLICATION DATA

Delete "Provisional application No. 60/004,404, Jun. 21, 1995." and insert -- Provisional application No. 60/000,404, June. 21, 1995.--.

IN THE SPECIFICATION

In column 5, line 14, delete "source 10." and insert --source IO.--.

In column 5, line 14, delete "source 10 is" and insert --source IO is--.

In column 7, line 15, delete "Ser. No. 08/585/398" and insert --Ser. No. 08/585,398--.

In column 7, line 40, delete "composite video signal CVINR" and insert --composite video signal CVInR--.

IN THE CLAIMS

In column 8, line 25, delete "element for strong" and insert --element for storing--.

In column 8, line 34, delete " for strong a" and insert --for storing a--.